United States Patent
Wei et al.

(10) Patent No.: US 12,092,588 B2
(45) Date of Patent: Sep. 17, 2024

(54) METHOD FOR CHARACTERIZING DEFECTS IN SILICON CRYSTAL

(71) Applicants: Zing Semiconductor Corporation, Shanghai (CN); Shanghai Institute of Microsystem and Information Technology, Chinese Academy of Sciences, Shanghai (CN)

(72) Inventors: Xing Wei, Shanghai (CN); Yun Liu, Shanghai (CN); Zhongying Xue, Shanghai (CN)

(73) Assignees: Zing Semiconductor Corporation, Shanghai (CN); Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 189 days.

(21) Appl. No.: 17/684,848

(22) Filed: Mar. 2, 2022

(65) Prior Publication Data
US 2022/0291145 A1    Sep. 15, 2022

(30) Foreign Application Priority Data
Mar. 10, 2021    (CN) .......................... 202110260251.3

(51) Int. Cl.
*C30B 29/06* (2006.01)
*G01N 21/956* (2006.01)
*G01N 21/88* (2006.01)

(52) U.S. Cl.
CPC ....... *G01N 21/95607* (2013.01); *C30B 29/06* (2013.01); *G01N 21/95692* (2013.01); *G01N 2021/8864* (2013.01)

(58) Field of Classification Search
CPC ....... G01N 21/95607; G01N 21/95692; G01N 21/8864; C30B 29/06
See application file for complete search history.

(56) References Cited

U.S. PATENT DOCUMENTS

| | | | | |
|---|---|---|---|---|
| 6,162,735 A | * | 12/2000 | Zimmermann | ......... H01L 22/26 438/719 |
| 2004/0020513 A1 | * | 2/2004 | Bergman | .................. B08B 3/08 134/2 |

(Continued)

FOREIGN PATENT DOCUMENTS

| | | |
|---|---|---|
| CN | 1214116 A | 4/1999 |
| CN | 102362171 A | 2/2012 |

(Continued)

OTHER PUBLICATIONS

Chinese Office Action and Search Report dated Dec. 10, 2021, in a counterpart Chinese patent application, No. CN 202110260251.3.

(Continued)

*Primary Examiner* — Robert M Kunemund
(74) *Attorney, Agent, or Firm* — Chen Yoshimura LLP

(57) ABSTRACT

The present application provides a method for characterizing defects in silicon crystal comprising the following steps: etching a surface of the silicon crystal to remove a predicted thickness of the silicon crystal; conducting a LLS scanning to a surface of the etched silicon crystal to obtain a LLS map of the surface, a LSE size of defects, and defect bulk density; based on at least one of the LLS map of the surface, the LSE size of defects and the defect bulk density, determining a type of defect existing in the silicon crystal and/or a defect zone of each type of defect on the surface. By applying the method, the characterizing period and the characterizing cost can be reduced, plural defects such as vacancy, oxygen precipitate and dislocation can be characterized simultaneously, the characterizing accuracy can be enhanced, and the defect type and the defect zone can be determined with high reliability. In addition, the method can be applied to all crystal defect types, is easy to operate, and is an environ- (Continued)

mentally friendly method for determination of grown-in defects.

8 Claims, 6 Drawing Sheets

(56) References Cited

U.S. PATENT DOCUMENTS

| | | | |
|---|---|---|---|
| 2006/0213424 A1* | 9/2006 | Mueller | ............ C30B 31/14 117/15 |
| 2012/0016630 A1 | 1/2012 | Shintani et al. | |
| 2018/0312994 A1 | 11/2018 | Tomii et al. | |
| 2020/0105500 A1 | 4/2020 | Chou et al. | |

FOREIGN PATENT DOCUMENTS

| | | |
|---|---|---|
| CN | 105651785 A | 6/2016 |
| CN | 108140593 A | 6/2018 |
| CN | 110969598 A | 4/2020 |
| TW | 429309 B | 4/2001 |
| WO | 2013055368 A1 | 4/2013 |

OTHER PUBLICATIONS

Chinese Office Action dated Jun. 21, 2022, in a counterpart Chinese patent application, No. CN 202110260251.3.
Chinese Supplemental Search Report dated Aug. 17, 2022, in a counterpart Chinese patent application, No. CN 202110260251.3.

* cited by examiner

After etching

→ V-rich
→ P-band
→ Pv

→ Pv

→ I-rich

Before etching

METHOD FOR CHARACTERIZING DEFECTS IN SILICON CRYSTAL

BACKGROUND OF THE INVENTION

1. Field of the Invention

The present invention relates to the field of defect in silicon crystal, and more particularly to characterization of defects in silicon crystal.

2. Description of the Related Art

Monocrystalline silicon is the most important substrate material. grown-in defects occurring in the silicon crystal during crystal growth and cooling significantly affect device properties. Characterization of defects is critical to study the defect formation and develop process for growing defect-free monocrystalline silicon.

Disadvantages of conventional characterization processes include long-term thermal treatment, complex chemical treatment, complex sample preparation, long characterization period, low characterization accuracy, and high resource and labor costs, and different methods for different defects. Further, the conventional characterization processes cannot guarantee productivity and quality of the products and are not environmentally friendly.

Therefore, there is a need for a method for characterizing defects in silicon crystal that can solve the above disadvantages.

SUMMARY

To solve the problems in conventional technologies, the present application provides a method for characterizing defects in silicon crystal comprising the following steps:
  etching a surface of the silicon wafer to remove a predicted thickness of the silicon wafer;
  conducting a localized light scattering (LLS) scanning to a surface of the etched silicon crystal to obtain a LLS map of the surface, a latex sphere equivalent (LSE) size of defects, and defect bulk density; and
  based on at least one of the LLS map of the surface, the LSE size of defects and the defect bulk density, determining a type of defect existing in the silicon crystal and/or a defect zone of each type of defect on the surface.

In one embodiment, the step of etching comprising:
conducting a pretreatment to the silicon crystal surface to remove an oxidation layer on the silicon crystal surface; and
etching the surface of the silicon crystal under atmosphere of a hydride of Group VII, at temperature of 700° C. or higher, for time period of 1 second (sec)-1000 sec, and with a flow rate of an etching gas of 100 sccm-1000 sccm.

In one embodiment, the defect bulk density is calculated based on a number of defects caused by the etching and the removed thickness.

In one embodiment, the LLS scanning is conducted to obtain the LSE size of each defect, and determining the defect type based on the LSE size.

In one embodiment, the step of determining the defect type based on the LSE size comprises:
before characterizing, establishing a relationship between the LSE size and the defect type;
during characterizing, obtaining the LSE size of a sample by the LLS scanning; and
comparing the obtained LSE size and the relationship to determining the defect type.

In one embodiment, the LLS scanning is conducted to obtain a location of each defect on the surface, thereby to obtain the defect bulk density distributed along a radius; and the defect zone of each type of defect is determined based on the defect type determined by the LSE size and the defect bulk density of each defect type, wherein each defect type has a number range of the defect bulk density In one embodiment, the defect type has different number ranges of the defect bulk density at different thickness of the silicon crystal, such that the method further comprises obtaining the number range of the defect bulk density of the defect type at different thickness of the silicon crystal.

In one embodiment, the defect zone of each defect type is determined based on the combination of the defect type, the defect bulk density of each defect type, and a regular pattern of adjacent defects.

In one embodiment, the type of defect comprises a vacancy, an oxygen precipitate, a self-interstitial atom aggregation, and a dislocation.

In one embodiment, the defect zone comprises a vacancy accumulation area, an oxidation-induced stacking fault area, a pure vacancy area, a pure self-interstitial atom area, and a self-interstitial atom aggregation area.

In one embodiment, the defect type and the defect zone are determined based on the LLS map of the surface and a regular pattern of adjacent defects.

To solve the conventional technical problems, the present application provides a method for characterizing defects in silicon crystal comprising the following steps: etching a surface of the silicon crystal to remove a predicted thickness of the silicon crystal; conducting a LLS scanning to a surface of the etched silicon crystal to obtain a LLS map of the surface, a LSE size of defects, and defect bulk density; based on at least one of the LLS map of the surface, the LSE size of defects and the defect bulk density, determining a type of defect existing in the silicon crystal and/or a defect zone of each type of defect on the surface. By applying the method, the characterizing period and the characterizing cost can be reduced, plural defects such as vacancy, oxygen precipitate and dislocation can be characterized simultaneously, the characterizing accuracy can be enhanced, and the defect type and the defect zone can be determined with high reliability. In addition, the method can be applied to all crystal defect types, is easy to operate, and is an environmentally friendly method for determination of grown-in defects.

DETAILED DESCRIPTION OF THE EMBODIMENTS

Figure 1A:
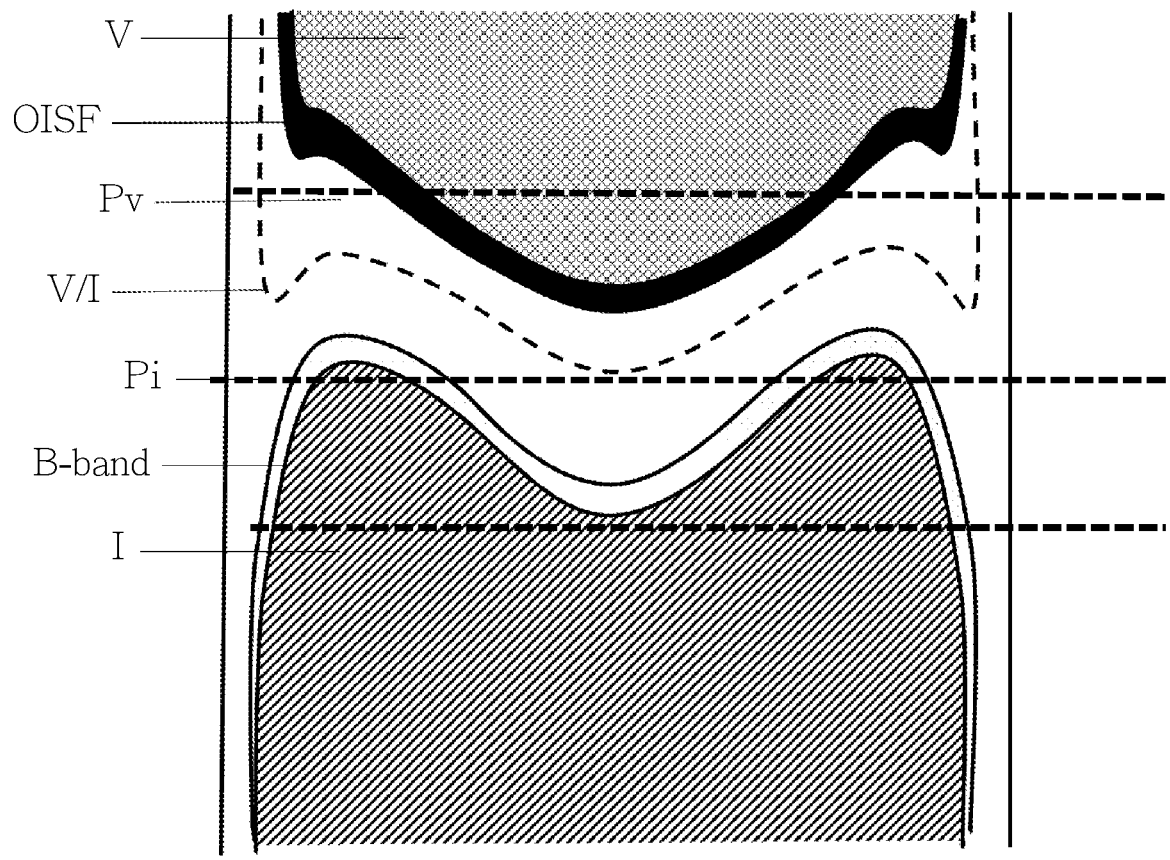
FIG. 1A illustrates the defect types in the structure described in embodiments of the present application.

To fully understand the present application, detailed structures or steps of the method for characterizing defects in silicon crystal are set forth in the following descriptions to explain the technical solutions of the present application. The implementation of the present application is not limited by the specific detail known by a person having ordinary skills in the art. The preferred embodiments of the present application are described in detail below, but the present application may have other embodiments in addition to the detailed description.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

For easy understanding of the purpose and features of the present invention, the embodiments of the present invention will be further described below with reference to the accompanying drawings. It should be specified that the drawings are provided with very simplified form and imprecise ratios for convenient and clear assistance in explaining the embodiments.

It should be noted that, unless otherwise specified or indicated, the description of the terms "first", "second", and "third" in the specification are only used to distinguish each component, element, step and the like in the specification, but not to indicate the logical relationship or sequence relationship between these components, elements, steps and the like.

Spatially relative terms, such as "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Exemplified embodiments described herein are with reference of the cross-sectional view of the schematic diagram of an idealized embodiment (and intermediate structures) of the present invention. Thus, shape alteration due to, for example, manufacturing techniques and/or tolerances can be expected. Accordingly, embodiments of the present invention should not be limited to the particular shapes of regions illustrated herein but are to include deviations in shapes caused by, for example, manufacturing. Thus, the area shown in figures are substantially schematic and their shapes are not intended to form the actual area of the display device and are not intended to limit the scope of the invention.

The present application provides a method for characterizing defects in silicon crystal comprising:

step S1: etching a surface of the silicon crystal to remove a predicted thickness of the silicon crystal;

step S2: conducting a LLS scanning to a surface of the etched silicon crystal to obtain a LLS map of the surface, a LSE size of defects, and defect bulk density; and step S3: based on at least one of the LLS map of the surface, the LSE size of defects and the defect bulk density, determining a type of defect existing in the silicon crystal and/or a defect zone of each type of defect on the surface.

By applying the method, the characterization period and the characterization cost can be reduced, plural defects such as vacancy, oxygen precipitate and dislocation can be characterized simultaneously, the characterization accuracy can be enhanced, and the defect type and the defect zone can be determined with high reliability. In addition, the method can be applied to all crystal defect types, is easy to operate, and is an environmentally friendly method for determination of grown-in defects.

Please also refer the drawings for further understanding the method of the present application. In accordance with embodiments of the present application, FIG. 1A illustrates the defect types in the structure described in the present application, FIG. 1B shows the LLS maps of the silicon crystal before etching, FIG. 1C shows the LLS maps of the silicon crystal after etching, FIG. 1D shows the sectional structure of the silicon crystal before etching, and FIG. 1E shows the sectional structure of the silicon crystal after etching, in accordance with one embodiment of the present application.

In the present application, the method for characterizing defects can be applied to a semiconductor material such as silicon, germanium, silicon germanium alloy, gallium arsenide, indium phosphide and the like, which can be etched by gaseous hydrogen chloride at high temperature. The semiconductor material is not restricted, and monocrystalline silicon is used as the example in the following description.

The monocrystalline silicon crystal can be produced by the Czochralski method (CZ method). The silicon crystal can also be produced by other methods, which are not described herein.

Figure 1B:
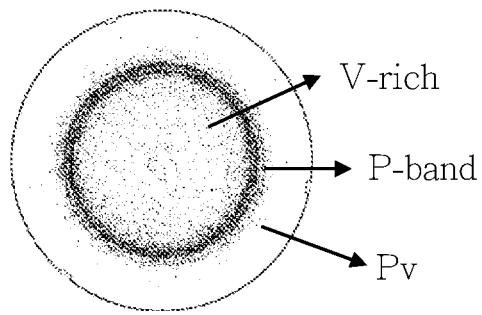
FIG. 1B shows the LLS maps of the silicon crystal before etching, in accordance with one embodiment of the present application.
Figure 1B:
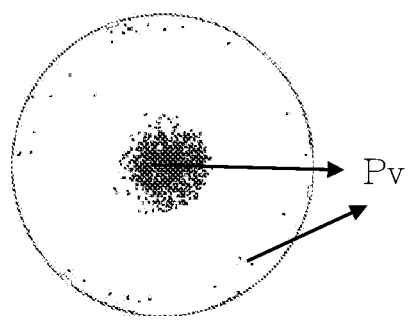
Figure 1B:
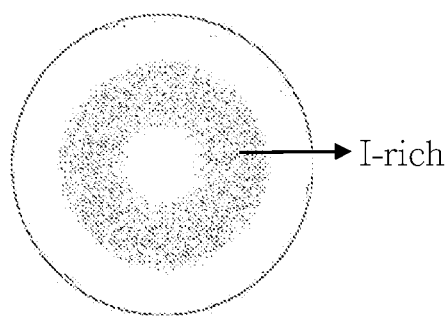
Figure 1C:
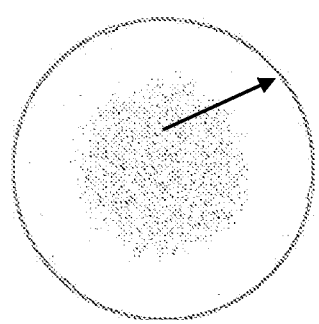
FIG. 1C shows the LLS maps of the silicon crystal after etching, in accordance with one embodiment of the present application.
Figure 1C:
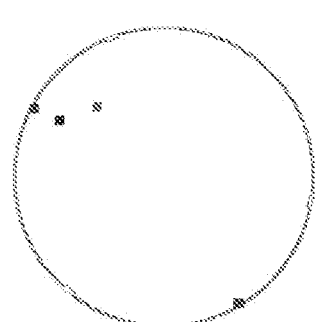
Figure 1C:
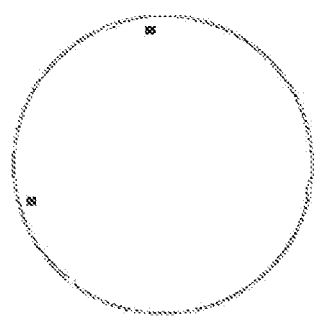
Figure 1D:
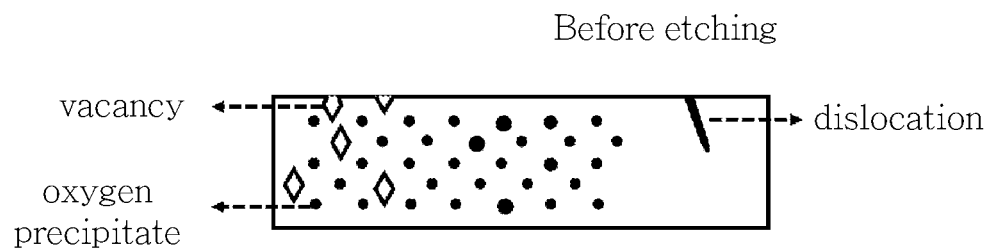
FIG. 1D shows the sectional structure of the silicon crystal before etching, in accordance with one embodiment of the present application.
Figure 1E:
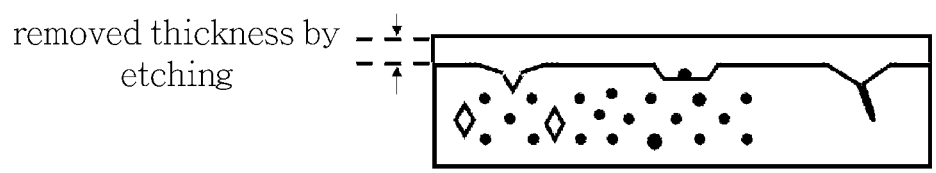
FIG. 1E shows the sectional structure of the silicon crystal after etching, in accordance with one embodiment of the present application.

Please refer FIG. 1A-1C to describe the types of defects. FIG. 1A shows the growth rate and the distribution of defects in the crystal. Firstly, introduction of the critical factors for the concentration of the point defect of void-type (vacancy) and the point defect of lattice gap-type silicon (interstitial-Si) are provided as follows.

In monocrystalline silicon, V region means a vacancy aggregation region, in which the vacancy including recess, hole and the like is caused by missing of silicon atom. I region means a region having aggregations of clusters of redundant silicon atoms and/or dislocations caused by redundant silicon atoms. Between the V region and the I region, N (neutral) region without insufficiency or redundancy of atom exists.

The concentration of the above two kinds of defects is determined by the relationship between the crystal growth rate and the temperature gradient G nearby the solid-liquid interface. It is known that a defect is called OISF (oxidation induced stacking fault) at the region surrounding the V region and the I region, which is annularly distributed when viewed from a cross section perpendicular to the crystal growth axis, hereinafter referred as "OISF ring".

When a CZ growth furnace with a larger temperature gradient near the crystal-melt interface is used, and the growth rate along with the crystal growth axis changes from high to low, the distribution of these defects caused in the crystal growth is shown in FIG. 1A.

These defects caused in the crystal growth can be classified. For example, at a higher growth rate, the growth defect caused by aggregation of point defects of vacancy exists in all regions along with the crystal axis at a high density. The zones having such defects are called vacancy-rich zone (V-rich zone), as shown in FIG. 1A. While the growth rate decreases, the OISF ring is formed surrounding the crystal. While the growth rate further decreases, the diameter of the OISF ring decreases and the pure vacancy zone (Pv zone) is formed on the outside of the ring. With the decrease of the rate, the V/I boundary zone is generated at the complete match between the growth rate and the crystal growth. The boundary zone contains perfect crystal without any defect. While the growth rate further decreases, I-rich zone is formed. Between the V/I boundary zone and the I-rich zone, the pure interstitial zone and the B-band/B-defect region can be formed.

The method of the present application can be broadly applied to characterize all of the above defects.

In the step S1, to characterize the defects better, the silicon crystal has to be etched. Because the gaseous reaction rate is different between the defects caused by lattice mismatch and the perfect crystals and the gaseous reaction of heterogeneous elements in some defects is anisotropic, the unique etching morphology is formed at the defect site and can be detected by LLS technology. For example, FIG. 1D shows the structure of defects in the silicon crystal before etching, and FIG. 1E shows the morphology of defects after etching.

In one embodiment, the step of etching to the silicon crystal comprises:
  conducting a pretreatment to the silicon crystal surface to remove the oxide layer on the silicon crystal surface;
  etching the surface of the silicon crystal under atmosphere of a hydride of Group VII, at temperature of 700° C. or higher, for time period of 1 second (sec)-1000 sec, and with a flow rate of an etching gas of 100 sccm-1000 sccm.

In one embodiment, an epitaxial reactor is used to conduct the gaseous chemical thermal treatment of the monocrystalline silicon wafer. The detail steps are as follows.

1. The thermal treatment is conducted at 1000° C. or higher, such as 1050° C. or higher, and preferably at about 1100° C. The flow rate of $H_2$ can be 10-1000 slm, or 20-80 slm, or about 60 slm. The time period of the thermal treatment is about 1-1000 sec, or about 10-500 sec, or about 50-100 sec.

2. The temperature is lowered to 700° C. or higher such as 900° C. Under the atmosphere of $H_2$, a hydride of Group VII is fed with a flow rate of 100-1000 sccm, 100-500 sccm, or about 300 sccm. The hydride of Group VII includes HF, HCl, HBr, HI. In one embodiment, HCl is used as the etching gas.

3. The gas phase reaction is conducted for about 1-1000 sec, or about 10-500 sec, or about 50-200 sec. Finally, the wafer is took out at 800° C.

In one embodiment, FIG. 1B shows the LLS maps of the silicon crystal before etching, and FIG. 1C shows the LLS maps of the silicon crystal after etching. Comparing FIG. 1B and FIG. 1C, after the etching to remove the predicted thickness, the defects on the surface can be observed more easily.

In the step S2, after the etching, a LLS scanning is conducted to the surface of the etched silicon crystal to obtain various data for defect characterization including a LLS map of the surface, a LSE size of defects, and defect bulk density.

In the present application, because the gaseous reaction of heterogeneous elements in some defects is anisotropic, the unique etching morphology is formed at the defect site after the etching of the step S1, and can be detected by LLS technology in the step S2. Thereby the defect type can be determined in the following steps.

In the step S2, the LLS process including the scanning model or the parameters can be set based on the requirement, and are not restricted herein.

After obtaining characterization data including the LLS map, the LSE size of defects, the defect bulk density and the like, the step S3 is conducted. In S3, based on at least one of the LLS map of the surface, the LSE size of defects and the defect bulk density, a type of defect existing in the silicon crystal and/or a defect zone of each type of defect on the surface can be determined.

In one embodiment, because different defects have different morphologies, the latex sphere equivalent size (LSE size) can be used for determination. In one embodiment, because different defect zones have different defect bulk densities and different space distribution, the scattering-scanning particle density can be used for determination.

In one embodiment, the LLS map can be directly applied for determination of defect type. For example, while the LLS map is simple and easy for observation, the defect type and the defect zone can be determined based on the LLS map and the regular pattern of adjacent defects.

The regular pattern of adjacent defects means that, on the surface obtained by the etching step, the defects distributed along the direction extending outwards from the center of the circle along the radius constitute a specifically regular pattern. For example, as shown in FIG. 1B, from the center of the circle along the radius extending outwards are the V-rich zone, the OISF ring and the Pv zone, and the location relationship of the three defects are affirmed. If the type and the location of one defect can be determined, the type and the location of the neighboring defect(s) can be also determined according to the specific distribution pattern. Such definition of the specific distribution pattern of defects (sometimes also referred as "a regular pattern of adjacent defects") can be referred hereafter unless other explanation(s) specifically provided.

In one embodiment, the defects can be classified by using latex sphere equivalent size (LSE size). The step includes: conducting a particle scattering scanning to obtain a LSE size of defects, and determining the defect type based on the obtained LSE size.

For the above purposes, the relationship between the LSE size and the defect type should be established before characterization. For example, in one embodiment of the present application, the latex sphere equivalent size (LSE size) of each type of defects are determined based on massive data, and the relationship between the LSE size and the defect type can be established accordingly. Then, the characterization of defect type in the sample can be conducted by obtaining the LSE size by the particle scattering scanning to the sample, and determining the defect type in the sample based on the established relationship between the LSE size and the defect type.

In one embodiment, a database comprising the data of LSE size and the data of corresponding defect types can be further established. Then, their relationship can be learned by a deep learning method or a network learning method, so that the defect type can be automatically obtained after the measurement of the LSE size.

In one embodiment, the method for characterizing defects can be applied automatically and/or manually.

In another embodiment, the particle scattering scanning is conducted to obtain a location of each defect on the surface, thereby to obtain the defect bulk density distributed along the radius. The defect bulk density is calculated based on the number of defects per unit area divided by the removed thickness Each defect type has a specific number range of the defect bulk density.

After the determination of defect type based on the LSE size, the defect zone of each defect type can be determined based on the defect bulk density of each defect type.

In one embodiment, the specific number range of the defect bulk density of the specific defect can be obtained based on massive data.

It should be noted that, in various depths of the silicon crystal, the defect has various number ranges of the defect bulk density. The method of the present application further comprises obtaining the number range of the defect bulk density of the defect type at different depths and/or different thickness of the silicon crystal.

In one embodiment, the method of the present application further comprises the defect zone of each defect type is determined based on the defect type, the defect bulk density of each defect type, and a regular pattern of adjacent defects.

Figure 2A:
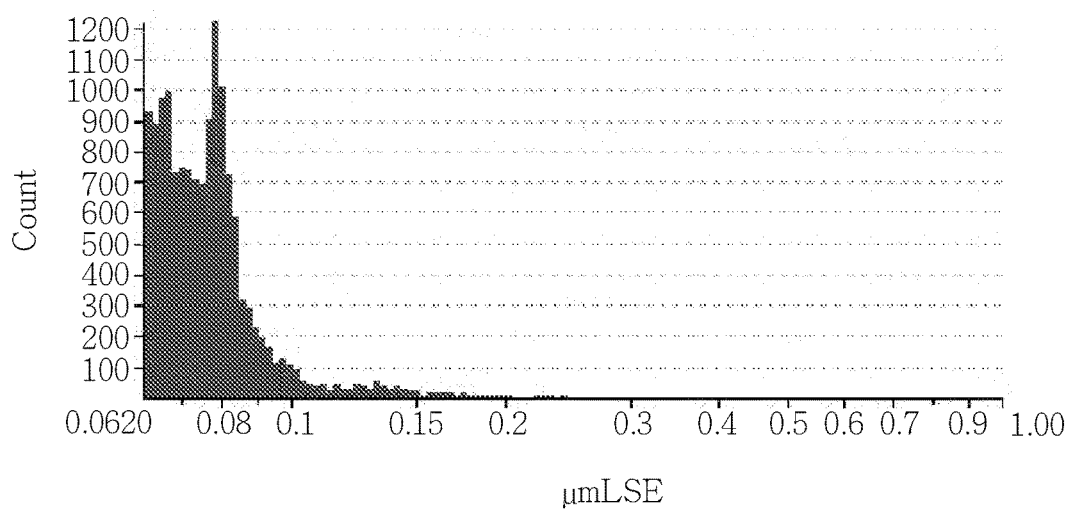
FIG. 2A shows the LSE size of the silicon crystal after etching, in accordance with one embodiment of the present application.
Figure 2B:
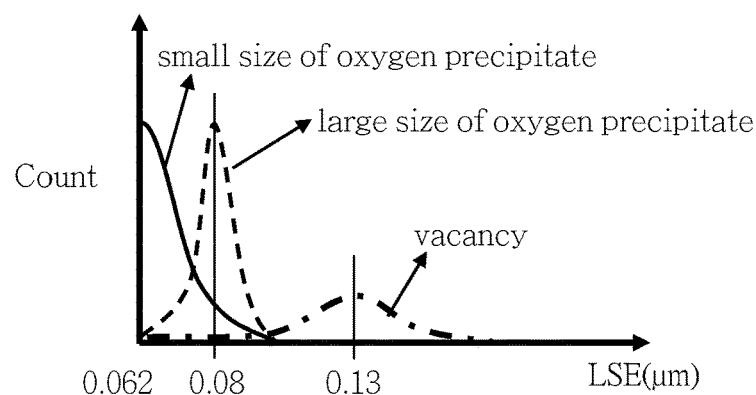
FIG. 2B is the breakdown illustration of FIG. 2A.
Figure 2C:
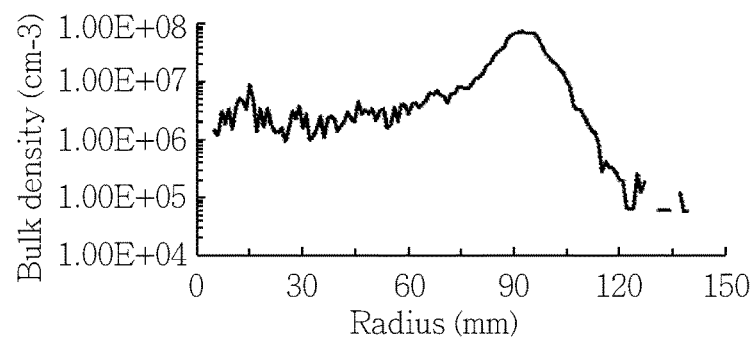
FIG. 2C shows the bulk density of the silicon crystal after etching, in accordance with one embodiment of the present application.

The characterization method will be described in detail below with reference to the accompanying drawings. In one embodiment, FIG. 2A shows the LSE size of the silicon crystal after etching; FIG. 2B is the breakdown illustration of FIG. 2A; and FIG. 2C shows the bulk density of the silicon crystal after etching.

In the embodiment, the step 1 is to conduct a particle scattering scanning to obtain a LSE size of every defect, and determine a type of defect existing in the silicon wafer by the obtained LSE size based on the relationship between the LSE size and the defect type, as shown in FIG. 2A and FIG. 2B. Three peaks, i.e. small size of oxygen precipitate, large size of oxygen precipitate, and vacancy, exist in the silicon wafer. The peak of small size of oxygen precipitate means existence of Pv, the peak of large size of oxygen precipitate means existence of OISF, and the peak of vacancy means existence of V-rich, so that it can be determined that three defect zones of V-rich OISF and Pv exist in the silicon wafer. However, the specific range and the location of the three defect zones are still unknown at this point of time.

The step 2 is to conduct the LLSscanning to obtain a location of every defect on the silicon wafer, thereby to obtain the defect bulk density (the number of defects per unit area divided by the removed thickness) distributed along the radius. Since the existence of the three defect zones of V-rich, OISF and Pv in the silicon wafer is known, the different densities of the different defect zones and the regular pattern of adjacent defects are applied to determine the scope of the V-rich zone, the OISF zone and the Pv zone. The density of the defect zone are, as shown in FIG. 2C, V-rich: $1E^6 \sim 1E^7 (cm^{-3})$, OISF: $1E^8 (cm^{-3})$, Pv: $0 \sim 1E^8 (cm^{-3})$.

Figure 3A:
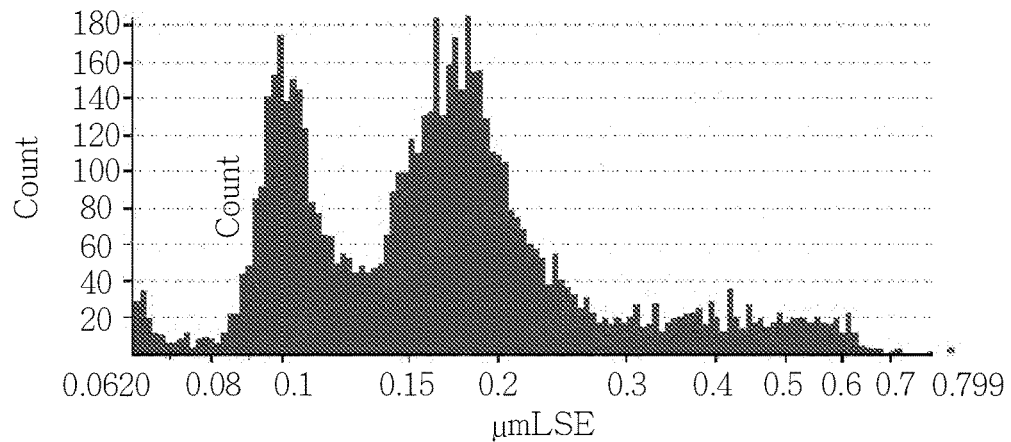
FIG. 3A shows the LSE size of the silicon crystal after etching, in accordance with another embodiment of the present application.
Figure 3B:
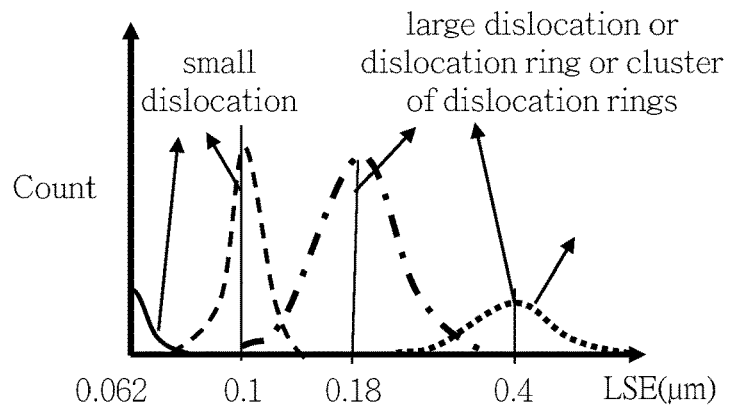
FIG. 3B is the breakdown illustration of FIG. 3A.
Figure 3C:
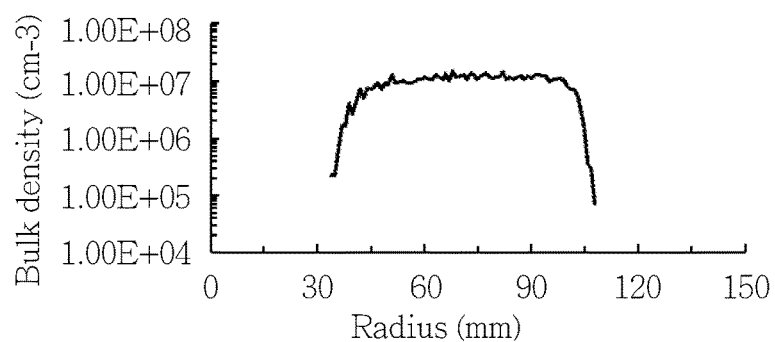
FIG. 3C shows the bulk density of the silicon crystal after etching, in accordance with another embodiment of the present application.
Figure 4:
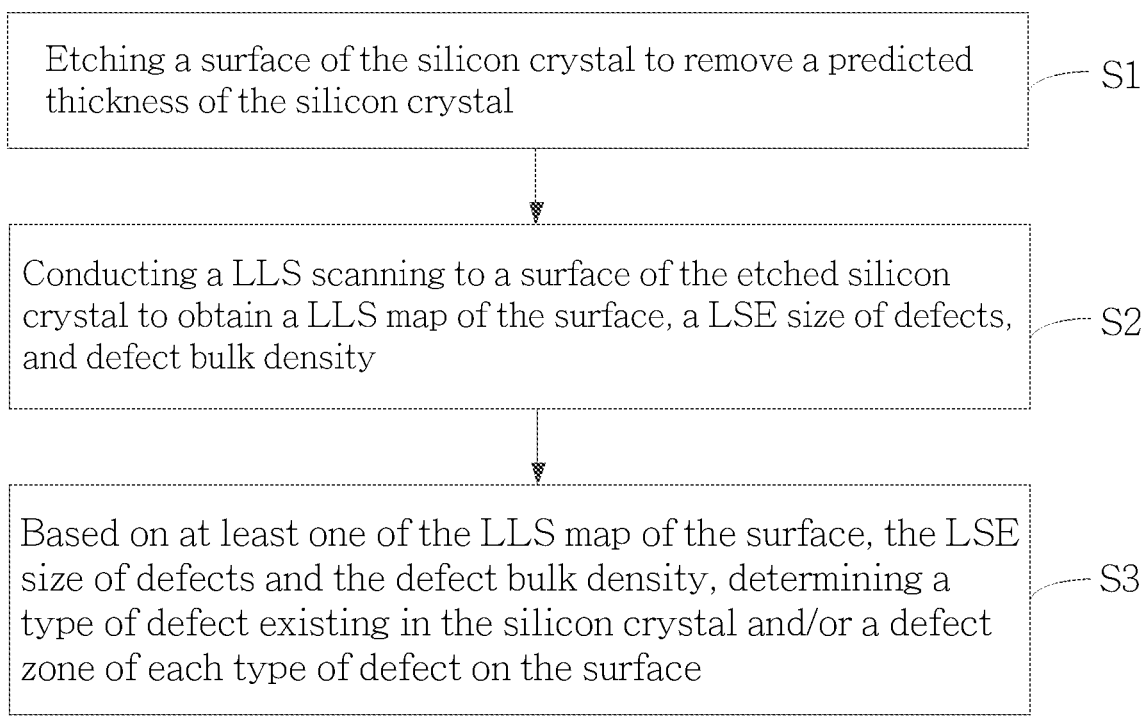
FIG. 4 is a flowchart illustrating method steps for characterization of defects in silicon crystal in accordance with one embodiment of the present application.

In another embodiment, FIG. 3A shows the LSE size of the silicon crystal after etching, FIG. 3B is the breakdown illustration of FIG. 3A, and FIG. 3C shows the bulk density of the silicon crystal after etching.

In the embodiment, the step 1 is to conduct a particle scattering scanning to obtain a LSE size of every defect, and determine a type of defect existing in the silicon wafer by the obtained LSE size, as shown in FIG. 3A and FIG. 3B. Based on the relationship between the LSE size and the defect type, four peaks exist in the silicon wafer, in which the two small peaks mean the small dislocation and the two large peaks mean the large dislocation or dislocation ring or cluster of dislocation rings. It can be determined that I-rich defect zone exist in the silicon wafer. However, the specific range and the location of the defect zone is still unknown at this point of time.

The step 2 is to conduct the particle scattering scanning to obtain a location of every defect on the silicon wafer, thereby to obtain the defect bulk density (the number of defects per unit area divided by the removed thickness) distributed along the radius. Since the existence of the I-rich defect zone in the silicon wafer is known, the different densities of the different defect zones and the regular pattern of adjacent defects are applied to determine the scope of the I-rich zone. The density of the defect zone is, as shown in FIG. 3C, I-rich: $0 \sim 1E^7 (cm^{-3})$. The regular pattern of adjacent defects is the I-rich zone immediately adjacent to the non-defect zone.

To solve the problems in conventional technologies, the present application provides a method for characterizing defects in silicon crystal comprising the following steps: conducting a LLS scanning to a surface of the etched silicon crystal to obtain a LLS map of the surface, a LSE size of defects, and defect bulk density; and determining a type of defect existing in the silicon crystal and/or a defect zone of each type of defect on the surface based on at least one of the LLS map of the surface, the LSE size of defects and the defect bulk density. By applying the method, the characterizing period and the characterizing cost can be reduced; plural defects such as vacancy, oxygen precipitate and dislocation can be characterized simultaneously; the characterizing accuracy can be enhanced; and the defect type and the defect zone can be classified and determined with high reliability. In addition, the method can be applied to all types of crystal defects with easy operation. It is an environmentally friendly method for determination of grown-in defects.

Those skilled in the art can recognize that the illustrative units or algorithm steps in the above described embodiments can be implemented by hardware, or software, or a combination of hardware and software. The implementation by hardware or software depends on specific application of technical solution and design constraints. Those skilled in the art can implement the described function by applying various means to various specific applications. Such implementation should not be considered to extend beyond the scope of this invention.

Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

It should be appreciated that to simplify the present disclosure and help to understand one or more of the inventive aspects, in the foregoing descriptions of the exemplary embodiments of the present disclosure, features of the present disclosure are sometimes grouped into a single embodiment or figure, or descriptions thereof. However, the methods in the present disclosure should not be construed as reflecting the following intention: that is, the present disclosure claimed to be protected is required to have more features than those clearly set forth in each claim. Or rather, as reflected in the following claims, the inventive aspects aim to be fewer than all features of a single embodiment disclosed above.

Those persons skilled in the art may understand that, unless at least some of such features and/or processes or units are mutually exclusive, all features disclosed in this specification (including the accompanying claims, abstract, and drawings) and all processes or units in any disclosed method or device may be combined by using any combination. Unless otherwise definitely stated, each feature disclosed in this specification (including the accompanying claims, abstract, and drawings) may be replaced with a replacement feature providing a same, an equivalent, or a similar objective.

It should be noted that, unless otherwise specified or indicated, the description of the terms "first", "second", and "third" in the specification are only used to distinguish each component, element, step and the like in the specification, but not to indicate the logical relationship or sequence relationship between these components, elements, steps and the like.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A method for characterizing defects in silicon crystal comprising the following steps:
    etching a surface of the silicon crystal to remove a predicted thickness of the silicon crystal;
    conducting a localized light scattering (LLS) scanning to a surface of the etched silicon crystal to obtain a LLS map of the surface, a latex sphere equivalent (LSE) size of defects, and defect bulk density; and
    determining a type of defect existing in the silicon crystal and/or a defect zone of each type of defect on the surface based on at least one of the LLS map of the surface, the LSE size of defects and the defect bulk density;
    wherein the defect bulk density is calculated based on a number of defects caused by the etching and the predicted thickness,
    wherein the LLS scanning is conducted to obtain the LSE size of each defect, and the defect type is determined based on the LSE size;
    wherein the step of determining the defect type based on the LSE size comprises:
        before characterizing, establishing a relationship between the LSE size and the defect type;
        during characterizing, obtaining the LSE size of a sample by the LLS scanning; and
        comparing the obtained LSE size and the relationship to determining the defect type.

2. The method of claim 1, wherein the step of etching comprising:
    conducting a pretreatment to the silicon crystal surface to remove an oxidation layer on the silicon crystal surface;
    etching the surface of the silicon crystal under atmosphere of a hydride of Group VII, at temperature of 700° C. or higher, for time period of 1 second (sec)- 1000 sec, and with a flow rate of an etching gas of 100 sccm –1000 sccm.

3. The method of claim 1, wherein the LLS scanning is conducted to obtain a location of each defect on the surface, thereby to obtain the defect bulk density distributed along a radius; and
    the defect zone of each type of defect is determined based on the defect type determined by the LSE size and the defect bulk density of each defect type, wherein each defect type has a number range of the defect bulk density.

4. The method of claim 3, wherein the defect type has different number ranges of the defect bulk density at different thickness of the silicon crystal, such that the method further comprises obtaining the number range of the defect bulk density of the defect type at different thickness of the silicon crystal.

5. The method of claim 3, wherein the defect zone of each defect type is determined based on the defect type, the defect bulk density of each defect type, and a regular pattern of adjacent defects.

6. The method of claim 1, wherein the type of defect comprises a vacancy, an oxygen precipitate, a self-interstitial atom aggregation, and a dislocation.

7. The method of claim 1, wherein the defect zone comprises a vacancy accumulation area, an oxidation-induced stacking fault area, a pure vacancy area, a pure self-interstitial atom area, and a self-interstitial atom aggregation area.

8. The method of claim 1, wherein the defect type and the defect zone are determined based on the LLS map of the surface and a regular pattern of adjacent defects.

* * * * *